US009966282B2

(12) United States Patent
Miyazaki et al.

(10) Patent No.: US 9,966,282 B2
(45) Date of Patent: May 8, 2018

(54) SUBSTRATE PROCESSING APPARATUS AND SUBSTRATE PROCESSING METHOD (71) Applicant: SHIBAURA MECHATRONICS CORPORATION, Yokohama-shi (JP)

(72) Inventors: Kunihiro Miyazaki, Yokohama (JP); Kenji Minami, Yokohama (JP); Yuji Nagashima, Yokohama (JP); Konosuke Hayashi, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 0 days. days.

(21) Appl. No.: 14/867,458

(22) Filed: Sep. 28, 2015

(65) Prior Publication Data

US 2016/0093486 A1 Mar. 31, 2016

(30) Foreign Application Priority Data

Sep. 30, 2014 (JP) .................................. 2014-201483
Aug. 21, 2015 (JP) .................................. 2015-163850

(51) Int. Cl.
H01L 21/02 (2006.01)
H01L 21/67 (2006.01)
(Continued)

(52) U.S. Cl.
CPC .......... *H01L 21/6708* (2013.01); *G03F 7/423* (2013.01); *H01L 21/31133* (2013.01)

(58) Field of Classification Search
CPC . G03F 7/423; H01L 21/31133; H01L 21/6708
See application file for complete search history.

(56) References Cited

U.S. PATENT DOCUMENTS 6,951,221 B2 * 10/2005 Okuda ...................... B08B 1/04
134/103.2
2003/0176078 A1 9/2003 Osawa et al.
(Continued)

FOREIGN PATENT DOCUMENTS

JP 61-105847 A 5/1986
JP 2000-91288 A 3/2000
(Continued)

OTHER PUBLICATIONS

English Machine Translation of Description of JP 2013074090 A (Eri, Apr. 2013).*
(Continued)

*Primary Examiner* — Michael E Barr
*Assistant Examiner* — Irina Graf
(74) *Attorney, Agent, or Firm* — Oblon, McClelland, Maier & Neustadt, L.L.P.

(57) ABSTRACT

According to one embodiment, a substrate processing apparatus includes a first liquid supplier, a second liquid supplier, and a controller. The first liquid supplier supplies a substrate with a sulfuric acid solution having a first temperature equal to or higher than the boiling point of hydrogen peroxide water. The second liquid supplier supplies a surface to be treated of the substrate with a mixture of sulfuric acid solution and hydrogen peroxide water having a second temperature lower than the first temperature. The controller controls the first liquid supplier to supply the sulfuric acid solution so as to heat the substrate to the boiling point of hydrogen peroxide water or higher. When the temperature of the substrate becomes equal to or higher than the second temperature, the controller controls the first liquid supplier to stop supplying the sulfuric acid solution and controls the second liquid supplier to supply the mixture.

10 Claims, 3 Drawing Sheets (51) Int. Cl.
*G03F 7/42* (2006.01)
*H01L 21/311* (2006.01)

(56) References Cited

U.S. PATENT DOCUMENTS

| | | | | |
|---|---|---|---|---|
| 2004/0194812 | A1* | 10/2004 | Matsuno | B08B 3/12 |
| | | | | 134/27 |
| 2004/0261817 | A1* | 12/2004 | Araki | H01L 21/67051 |
| | | | | 134/2 |
| 2005/0221621 | A1* | 10/2005 | Mikhaylichenko | B08B 3/02 |
| | | | | 438/745 |
| 2006/0107976 | A1* | 5/2006 | Boyers | A61L 2/183 |
| | | | | 134/94.1 |
| 2006/0196531 | A1* | 9/2006 | Amai | B08B 3/04 |
| | | | | 134/110 |
| 2007/0114208 | A1 | 5/2007 | Takahashi | |
| 2008/0041427 | A1* | 2/2008 | Brown | H01L 21/67109 |
| | | | | 134/56 R |
| 2011/0277793 | A1* | 11/2011 | Inada | H01L 21/67051 |
| | | | | 134/18 |
| 2012/0312336 | A1* | 12/2012 | Itoh | H01L 21/67051 |
| | | | | 134/36 |
| 2013/0048609 | A1* | 2/2013 | Ito | H01L 21/67051 |
| | | | | 216/83 |
| 2013/0104943 | A1* | 5/2013 | Ryu | H01L 21/67051 |
| | | | | 134/108 |
| 2015/0060407 | A1* | 3/2015 | Negoro | C11D 3/0052 |
| | | | | 216/92 |
| 2015/0162211 | A1* | 6/2015 | Siefering | H01L 21/31111 |
| | | | | 438/749 |

FOREIGN PATENT DOCUMENTS

| | | | | |
|---|---|---|---|---|
| JP | 2000119874 | A | * | 4/2000 |
| JP | 2003-273066 | A | | 9/2003 |
| JP | 2005123336 | A | * | 5/2005 |
| JP | 2006344907 | A | * | 12/2006 |
| JP | 2007-165842 | | | 6/2007 |
| JP | 2008-235341 | | | 10/2008 |
| JP | 2009-54717 | A | | 3/2009 |
| JP | 2012096148 | A | * | 5/2012 |
| JP | 2013074090 | A | * | 4/2013 |
| JP | 2013077843 | A | * | 4/2013 |
| JP | 2014179490 | A | * | 9/2014 |

OTHER PUBLICATIONS

Combined Taiwanese Office Action and Search Report dated Jul. 27, 2016 in Patent Application No. 104131269 (with Partial English translation and English translation of categories of cited documents).

Office Action dated Dec. 13, 2016 in Korean Patent Application No. 10-2015-0134549 with English translation.

* cited by examiner

| H₂SO₄ (wt%) | BOILING POINT (°C) |
|---|---|
| 0.00 | 100 |
| ⋮ | ⋮ |
| 15.25 | 102.7 |
| ⋮ | ⋮ |
| 29.53 | 107.3 |
| ⋮ | ⋮ |
| 45.35 | 118.2 |
| ⋮ | ⋮ |
| 59.32 | 138.4 |
| 62.18 | 144.4 |
| 65.13 | 151.1 |
| 68.13 | 159.2 |
| 71.17 | 168.3 |
| 74.36 | 179.7 |
| ⋮ | ⋮ |
| 90.60 | 259 |
| ⋮ | ⋮ |
| 95.00 | 297 |
| 96.00 | 308 |
| 97.00 | 319 |
| 98.00 | 327 |
| 99.00 | 310 |
| 100.00 | 274 |

SUBSTRATE PROCESSING APPARATUS AND SUBSTRATE PROCESSING METHOD

CROSS-REFERENCE TO THE RELATED APPLICATION

This application is based on and claims the benefit of priority from Japanese Patent Applications No. 2014-201483, filed on Sep. 30, 2014 and No. 2015-163850, filed on Aug. 21, 2015; the entire contents of which are incorporated herein by reference.

FIELD

Embodiments described herein relate generally to a substrate processing apparatus and a substrate processing method.

BACKGROUND

A substrate processing apparatus is used in the process of manufacturing semiconductor devices, liquid crystal panels, or the like. The substrate processing apparatus is configured to supply a treatment liquid to a surface of a substrate, such as a wafer or a liquid crystal substrate, to thereby treat the surface. Among such substrate processing apparatuses are spin processors. The spin processor is configured to supply a treatment liquid to substantially the center of a surface of a horizontally rotating substrate so that the treatment liquid spreads over the surface by the centrifugal force of the rotation. Further, there have been developed such spin processors that collect used treatment liquid to recycle it.

For example, to remove a resist from a surface of a substrate with a substrate processing apparatus as described above, SPM treatment is applied using a SPM (a mixture of sulfuric acid solution and hydrogen peroxide water) as a treatment liquid. In the single wafer processing of a substrate with SPM treatment, SPM is supplied to the substrate by several approaches such as mixing a sulfuric acid solution and hydrogen peroxide water in advance and then the mixture is supplied or mixing them on the substrate. After the removal of the resist, the substrate is washed and dried, or treated by a different treatment liquid after having been washed, then washed again and dried. After that, the substrate is passed to the next process.

There is a case where the SPM treatment using SPM only is insufficient. For example, when ion implantation is performed on a surface of a substrate, the surface of a resist film is cured (altered) thereafter. It is difficult to remove the cured resist by the SPM treatment, and some resist remains on the substrate. Therefore, to improve the treatment performance, high-temperature SPM (e.g., 160° C.) is sometimes used to treat the substrate.

However, the life of hydrogen peroxide water is reduced as its temperature rises. Accordingly, when mixed with a sulfuric acid solution and has a high temperature, the hydrogen peroxide water has been being decomposed before arriving at the substrate, resulting in insufficient improvement in the treatment performance. If a large amount of hydrogen peroxide water is mixed with a sulfuric acid solution to keep the water left, the sulfuric acid solution is attenuated. This makes it difficult to recycle the treatment liquid, thereby increasing the total usage of the treatment liquid. Besides, when hot sulfuric acid solution and hydrogen peroxide water are mixed together, bumping of the hydrogen peroxide water, i.e., bumping (violent boiling) of $H_2O$ of $H_2O_2$, occurs as they are not fully mixed. As a result, the hydrogen peroxide water evaporates. More specifically, when high-temperature sulfuric acid solution (160° C.) is brought in contact with hydrogen peroxide water, $H_2O$, i.e., a component of the hydrogen peroxide water, boils rapidly by the temperature of the solution. Because of this phenomenon, the hydrogen peroxide water evaporates before mixed with the sulfuric acid solution, and therefore, oxidizing substances, such as peroxymonosulfuric acid and peroxydisulfuric acid, which contribute to resist stripping are not generated. This may result in insufficient improvement in the treatment performance. From these factors, improvement in the treatment performance and reduction in the usage of treatment liquid are desired.

DETAILED DESCRIPTION

According to one embodiment, a substrate processing apparatus includes a first liquid supplier, a second liquid supplier, and a controller. The first liquid supplier is configured to supply a substrate with a sulfuric acid solution having a first temperature that is equal to or higher than the boiling point of hydrogen peroxide water. The second liquid supplier is configured to supply a surface to be treated of the substrate with a mixture of sulfuric acid solution and hydrogen peroxide water having a second temperature that is lower than the first temperature. The controller is configured to control the first liquid supplier to supply the sulfuric acid solution having the first temperature so as to heat the substrate to the boiling point of hydrogen peroxide water or higher. When the temperature of the substrate becomes equal to or higher than the second temperature, the controller controls the first liquid supplier to stop supplying the sulfuric acid solution having the first temperature and controls the second liquid supplier to supply the mixture having the second temperature.

According to another embodiment, a substrate processing method includes: supplying a substrate with a sulfuric acid solution having a first temperature that is equal to or higher than the boiling point of hydrogen peroxide water to raise the temperature of the substrate to the boiling point of hydrogen peroxide water or higher; and stopping the supply of the sulfuric acid solution having the first temperature when the temperature of the substrate becomes equal to or higher than the boiling point of hydrogen peroxide water, and supplying a surface to be treated of the substrate with a mixture of sulfuric acid solution and hydrogen peroxide water, which has a second temperature that is lower than the first temperature.

Embodiments will be described with reference to the drawings.

Figure 1:
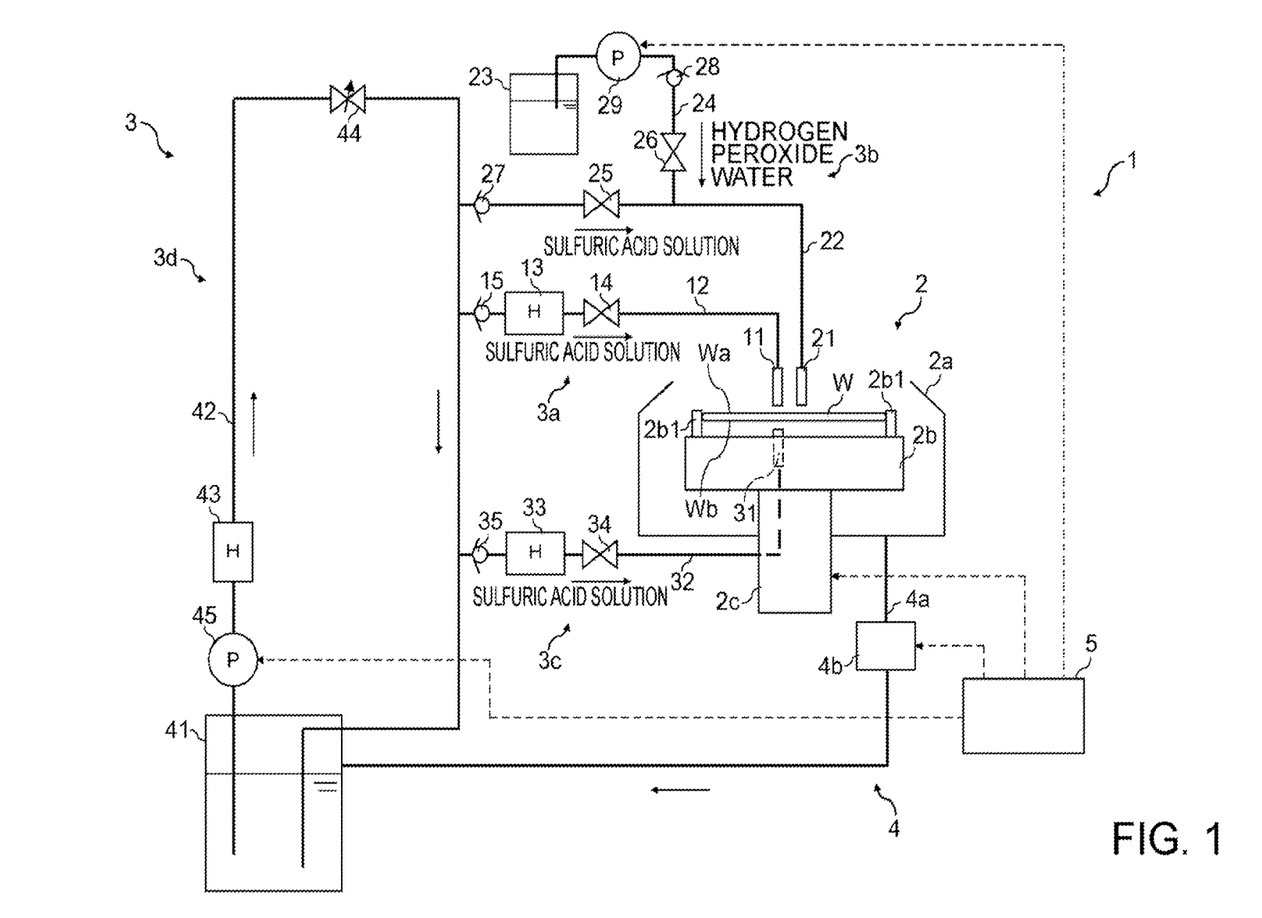
FIG. 1 is a view illustrating a schematic configuration of a substrate processing apparatus according to an embodiment.

As illustrated in FIG. 1, according to an embodiment, a substrate processing apparatus 1 includes a substrate treatment tank 2, a liquid supply device 3, a liquid return part 4, and a controller 5. The substrate treatment tank 2 is used for treating a substrate W with a treatment liquid. The liquid supply device 3 is configured to supply the treatment liquid to the substrate treatment tank 2. The liquid return part 4 is configured to return the treatment liquid discharged from the substrate treatment tank 2 to the liquid supply device 3. The controller 5 controls each of the substrate treatment tank 2, the liquid supply device 3, and the liquid return part 4. Incidentally, in this embodiment, a mixture of sulfuric acid solution and hydrogen peroxide water (hereinafter, simply referred to as "SPM") is used as the treatment liquid.

The substrate treatment tank 2 includes a cup 2a inside the tank, a table 2b configured to support the substrate W horizontally in the cup 2a, and a rotation mechanism 2c configured to rotate the table 2b in a horizontal plane.

The cup 2a is formed in a cylindrical shape, and surrounds the periphery of the table 2b to accommodate it therein. The cup 2a includes a peripheral wall having an upper portion inclined inwardly in the radial direction, and an opening to expose a surface Wa of the substrate W, i.e., a surface to be treated, on the table 2b. The cup 2a is configured to receive a treatment liquid flowing down from the surface Wa of the rotating substrate W, and those scattered from the surface Wa and a surface Wb opposite to the surface Wa.

The table 2b is located near the center in the cup 2a to be rotatable in the horizontal plane. The table 2b includes a plurality of support members 2b1 such as pins. The table 2b supports the substrate W such as a wafer or a liquid crystal substrate by holding it between the support members 2b1. The substrate W has a resist film (resist layer) for masking on the surface Wa to be treated.

The rotation mechanism 2c is configured to rotate the table 2b about its center. The rotation mechanism 2c includes a rotation shaft connected to the center of the table 2b and a motor to rotate the rotation shaft (all not illustrated). The motor is electrically connected to the controller 5, and operates under the control of the controller 5.

The liquid supply device 3 includes first to third liquid suppliers 3a, 3b and 3c, and a liquid circulator 3d. The first liquid supplier 3a supplies the surface Wa of the substrate W with a sulfuric acid solution at a first temperature. The second liquid supplier 3b supplies the surface Wa with SPM at a second temperature. The third liquid supplier 3c supplies the surface Wb opposite to the surface Wa with a sulfuric acid solution at a third temperature. The liquid circulator 3d circulates the sulfuric acid solution to be supplied to the first to third liquid suppliers 3a, 3b and 3c.

Here, the first temperature is a predetermined substrate processing temperature equal to or higher than the boiling point of hydrogen peroxide water. The second temperature is lower than the first temperature, while the third temperature is equal to or higher than the first temperature. The range of the predetermined substrate processing temperature refers to the range of temperature during the treatment of the substrate W with SPM, and is set to, for example, 150° C. to 308° C. (details described later). As one example, when the predetermined substrate processing temperature is determined to be 150° C., the first temperature is 150° C., the second temperature is less than 150° C., and the third temperature is 150° C. or higher. When, for example, the predetermined substrate processing temperature is determined to be 200° C., the first temperature is 200° C. and the third temperature is 200° C. or higher; however, the second temperature is still less than 150° C.

The first liquid supplier 3a includes a first nozzle 11, a supply tube 12, a heating unit 13, an open/close valve 14, and a check valve 15. The first nozzle 11 supplies the surface Wa of the substrate W on the table 2b with a sulfuric acid solution of the first temperature. The supply tube 12 connects the first nozzle 11 and the liquid circulator 3d. The heating unit 13 heats the sulfuric acid solution flowing in the supply tube 12. The open/close valve 14 opens or closes the supply tube 12. The check valve 15 limits the flow of the sulfuric acid solution to only one direction from the liquid circulator 3d to the first nozzle 11.

The first nozzle 11 ejects a sulfuric acid solution of the first temperature toward the surface Wa of the substrate W on the table 2b. The first nozzle 11 is arranged to be movable along the surface Wa of the substrate W on the table 2b. The first nozzle 11 is configured to eject the sulfuric acid solution toward the surface Wa while moving along the surface Wa or from a predetermined position facing substantially the center of the surface Wa.

The supply tube 12 is a tube that connects the first nozzle 11 and the liquid circulator 3d, and is provided with the open/close valve 14 and the check valve 15. For example, a solenoid valve or the like can be used as the open/close valve 14. The open/close valve 14 is electrically connected to the controller 5, and opens or closes the flow path of the supply tube 12 under the control of the controller 5.

The heating unit 13 is arranged in the middle of the supply tube 12 so that it can heat the sulfuric acid solution flowing in the supply tube 12. The heating unit 13 is electrically connected to the controller 5, and heats the sulfuric acid solution flowing in the supply tube 12 under the control of the controller 5. For example, a heater may be used as the heating unit 13. The heating temperature is set to bring the temperature of the sulfuric acid solution flowing in the supply tube 12 to the first temperature.

The second liquid supplier 3b includes a second nozzle 21, a supply tube 22, a reservoir 23, a mixing tube 24, open/close valves 25 and 26, check valves 27 and 28, and a pump 29. The second nozzle 21 supplies the surface Wa of the substrate W on the table 2b with SPM of the second temperature. The supply tube 22 connects the second nozzle 21 and the liquid circulator 3d. The reservoir 23 retains hydrogen peroxide water. The mixing tube 24 connects the reservoir 23 and the supply tube 22. The open/close valve 25 opens or closes the supply tube 22. The open/close valve 26 opens or closes the mixing tube 24. The check valve 27 limits the flow of the sulfuric acid solution to only one direction from the liquid circulator 3d to the second nozzle 21. The check valve 28 limits the flow of hydrogen peroxide water to only one direction from the reservoir 23 to the supply tube 22. The pump 29 generates a liquid sending force. Incidentally, the second liquid supplier 3b functions as a mixed solution generator for mixing a sulfuric acid solution and hydrogen peroxide water, thereby generating SPM.

The second nozzle 21 ejects SPM of the second temperature toward the surface Wa of the substrate W on the table 2b. The second nozzle 21 is arranged to be movable along the surface Wa of the substrate W on the table 2b. The second nozzle 21 is configured to eject SPM toward the surface Wa while moving along the surface Wa or from a predetermined position facing substantially the center of the surface Wa.

The supply tube 22 is a tube that connects the second nozzle 21 and the liquid circulator 3d, and is provided with the open/close valve 25 and the check valve 27. For example, a solenoid valve or the like can be used as the open/close valve 25. The open/close valve 25 is electrically connected to the controller 5, and opens or closes the flow path of the supply tube 22 under the control of the controller 5.

The reservoir 23 is a tank that retains hydrogen peroxide water at room temperature (e.g., about 20° C. to 30° C.). The hydrogen peroxide water is sent from the reservoir 23 to the mixing tube 24 by the pump 29 being driven, and flows in the mixing tube 24. The pump 29 is electrically connected to the controller 5, and sends the hydrogen peroxide water from the reservoir 23 to the mixing tube 24 under the control of the controller 5.

The mixing tube 24 is a tube that connects the supply tube 22 in the downstream of the open/close valve 25 and the reservoir 23, and is provided with the open/close valve 26 and the check valve 28. For example, a solenoid valve or the like can be used as the open/close valve 26. The open/close valve 26 is electrically connected to the controller 5, and opens or closes the flow path of the mixing tube 24 under the control of the controller 5.

The mixing tube 24 supplies the supply tube 22 with hydrogen peroxide water to mix it with a sulfuric acid solution in the supply tube 22. When a sulfuric acid solution and hydrogen peroxide water are mixed together, the temperature of SPM rises to the second temperature due to the heat of reaction between them (details described later).

The third liquid supplier 3c includes a third nozzle 31, a supply tube 32, a heating unit 33, an open/close valve 34, and a check valve 35. The third nozzle 31 supplies the surface Wa of the substrate W on the table 2b with a sulfuric acid solution of the third temperature. The supply tube 32 connects the third nozzle 31 and the liquid circulator 3d. The heating unit 33 heats the sulfuric acid solution flowing in the supply tube 32. The open/close valve 34 opens or closes the supply tube 32. The check valve 35 limits the flow of the sulfuric acid solution to only one direction from the liquid circulator 3d to the third nozzle 31.

The third nozzle 31 ejects a sulfuric acid solution of the third temperature toward the surface Wb opposite to the surface Wa of the substrate W on the table 2b. The third nozzle 31 is configured to be capable of ejecting the sulfuric acid solution radially or while varying the ejection angle. The third nozzle 31 is configured to eject the sulfuric acid solution toward the surface Wb from a predetermined position facing substantially the center of the surface Wb opposite to the surface Wa to be treated.

The supply tube 32 is a tube that connects the third nozzle 31 and the liquid circulator 3d, and is provided with the open/close valve 34 and the check valve 35. For example, a solenoid valve or the like can be used as the open/close valve 34. The open/close valve 34 is electrically connected to the controller 5, and opens or closes the flow path of the supply tube 32 under the control of the controller 5.

The heating unit 33 is arranged in the middle of the supply tube 32 so that it can heat the sulfuric acid solution flowing in the supply tube 32. The heating unit 33 is electrically connected to the controller 5, and heats the sulfuric acid solution flowing in the supply tube 32 under the control of the controller 5. For example, a heater may be used as the heating unit 33. The heating temperature is set to bring the temperature of the sulfuric acid solution flowing in the supply tube 32 to the third temperature.

The liquid circulator 3d includes a reservoir 41, a circulation tube 42, a heating unit 43, a regulating valve 44, and a pump 45. The reservoir 41 retains a sulfuric acid solution. The circulation tube 42 circulates the sulfuric acid solution in the reservoir 41. The heating unit 43 heats the sulfuric acid solution flowing in the circulation tube 42. The regulating valve 44 regulates the open degree of the circulation tube 42 (i.e., the flow amount of the treatment liquid in circulation). The pump 45 generates a liquid sending force.

The reservoir 41 is a tank that retains a sulfuric acid solution at a temperature, for example, not less than 60° C. and not more than 120° C. The sulfuric acid solution is sent from the reservoir 41 to the circulation tube 42 by the pump 45 being driven, and flows in the circulation tube 42. The pump 45 is electrically connected to the controller 5, and sends the sulfuric acid solution from the reservoir 41 to the circulation tube 42 under the control of the controller 5.

The circulation tube 42 extends from the reservoir 41 and returns back to the reservoir 41 as a tube for circulating the sulfuric acid solution, and is provided with the regulating valve 44. For example, a solenoid valve or the like can be used as the regulating valve 44. The regulating valve 44 is electrically connected to the controller 5, and regulates the open degree of the circulation tube 42, i.e., the flow amount, under the control of the controller 5. The supply tube 12 of the first liquid supplier 3a, the supply tube 22 of the second liquid supplier 3b, and the supply tube 32 of the third liquid supplier 3c are individually connected to the circulation tube 42.

The heating unit 43 is arranged in the middle of the circulation tube 42 so that it can heat sulfuric acid solution flowing in the circulation tube 42. The heating unit 43 is electrically connected to the controller 5, and heats sulfuric acid solution flowing in the circulation tube 42 under the control of the controller 5. For example, a heater may be used as the heating unit 43. The heating temperature is set to bring the temperature of sulfuric acid solution flowing in the circulation tube 42 to below the boiling point of the sulfuric acid solution, for example, in the range of 60° C. to 120° C. As one example, the heating temperature is set to bring the temperature of the sulfuric acid solution to 80° C.

The liquid return part 4 includes a recovery tube 4a and a cooling part 4b. The recovery tube 4a is configured to recover liquid from the cup 2a of the substrate treatment tank 2. The cooling part 4b is configured to cool the recovered liquid flowing in the recovery tube 4a. The recovery tube 4a is a tube that connects the bottom surface of the cup 2a and the reservoir 41 of the liquid circulator 3d, and is provided with the cooling part 4b. For example, a peltier device, a heat exchanger or the like can be used as the cooling part 4b. The cooling part 4b is electrically connected to the controller 5, and heats recovered liquid flowing in the recovery tube 4a under the control of the controller 5. The cooling temperature is set to bring the temperature of the recovered liquid into the range of 60° C. to 120° C., for example, to 80° C. When the reaction of SPM takes place on the surface Wa of the substrate W, hydrogen peroxide water is decomposed into water, peroxymonosulfuric acid (persulfuric acid), and peroxydisulfuric acid, the recovered liquid is sulfuric acid solution.

Note that, as described above, while the cooling part 4b is provided because of a rise in the heat of reaction between sulfuric acid solution and hydrogen peroxide water in the recovered liquid, this is not a limitation. If the heat of reaction between sulfuric acid solution and hydrogen peroxide water does not matter much, i.e., if the temperature of the recovered liquid is within the range of 60° C. to 120° C., the recovered liquid is not required to be cooled. Accordingly, in this case, there is no need of the cooling part 4b.

The controller 5 includes a microcomputer that intensively controls each part, and a storage that stores substrate processing information related to substrate processing, various programs, and the like (all not illustrated). The controller 5 controls each part such as the substrate treatment tank 2, the liquid supply device 3, and the liquid return part 4 based on the substrate processing information and various programs. For example, the controller 5 controls substrate processing and liquid circulation by the substrate treatment tank 2 and the liquid supply device 3, and liquid recovery by the liquid return part 4.

Since, in this embodiment, SPM is used as the treatment liquid, the predetermined substrate processing temperature is desirably set in the range of 150° C. to 308° C. Described below are the upper limit and lower limit of the range.

Figure 2:
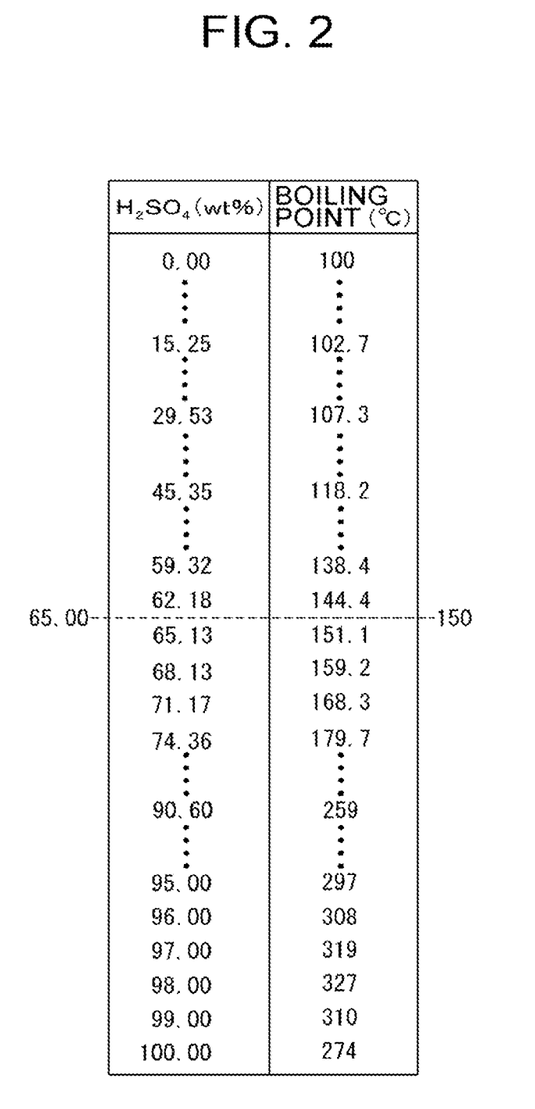
FIG. 2 is an explanatory view for explaining the relationship between the sulfuric acid concentration of a sulfuric acid solution and the boiling point in the embodiment.
Figure 3:
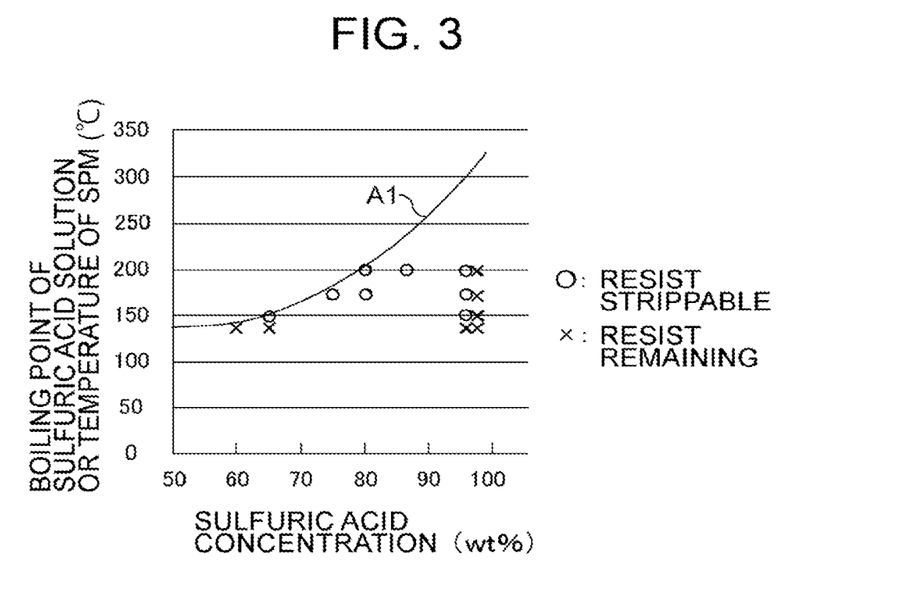
FIG. 3 is an explanatory view for explaining the results of the experiment of resist stripping of the embodiment.

FIG. 2 illustrates the relationship between the boiling point (° C.) and the sulfuric acid concentration (wt %: weight percent concentration) of a sulfuric acid solution. The weight percent concentration is expressed as (the quantity of solute/the quantity of solvent)×100. In FIG. 3, graph A1 indicates the relationship between the boiling point and the sulfuric acid concentration of a sulfuric acid solution. The experimental result (○ or x) of resist stripping is indicated with respect to each pair of the sulfuric acid concentration and the temperature of SPM.

In FIG. 3, a circle mark (○) indicates successful resist stripping (resist strippable), while a cross mark (x) indicates incomplete resist stripping with residual resist (resist remaining). As can be seen from FIG. 3, the resist can be stripped when the sulfuric acid concentration is within the range of about 65 wt % to about 96 wt %, and the temperature of SPM is above 150° C. Incidentally, if the sulfuric acid concentration is 65 wt %, the boiling point of hydrogen peroxide water is 150° C., and that of SPM is also 150° C. From the experimental results, it is found that the lower limit of the predetermined substrate processing temperature is desirably 150° C. or higher.

As can be seen from FIG. 2, to make the boiling point of the sulfuric acid solution above 150° C., the sulfuric acid concentration of the solution needs to be 65 wt % or higher. However, until the sulfuric acid concentration of the sulfuric acid solution is lowered to below 65 wt %, the liquid discharged from the substrate treatment tank 2 can be recovered to be used as the sulfuric acid solution.

The upper limit of the predetermined substrate processing temperature is determined from the temperatures at which a resist can be stripped. In FIG. 3, the range where a resist can be stripped is indicated by circle marks (○). The sulfuric acid concentration is 65 wt % to 96 wt % in the range indicated by circle marks (○). In this case, as illustrated in FIG. 2, the boiling point of the sulfuric acid solution is in the range of 150° C. to 308° C. Accordingly, as with the boiling point of the sulfuric acid solution, the temperature of SPM is in the range of 150° C. to 308° C. From the upper limit value of the boiling point of the sulfuric acid solution and the temperature of SPM, the upper limit of the predetermined substrate processing temperature is 308° C. For this reason, the upper limit of the predetermined substrate processing temperature is preferably 308° C. or less.

The ratio of the sulfuric acid solution and hydrogen peroxide water in the mixture mentioned above varies due to the removal process. If the concentration of hydrogen peroxide water decreases, the stripping performance degrades. Therefore, for example, the volume ratio of the sulfuric acid solution:hydrogen peroxide water is 100:1 to 3:1 (the volume of the sulfuric acid solution is, for example, not less than three times and not more than 100 times the volume of the hydrogen peroxide water). More preferably, $H_2SO_4$ (98 wt %):$H_2O_2$ (35 wt %)=7:3 to 20:1.

Incidentally, in the second liquid supplier 3b, the diameter of the supply tube 22 and the mixing tube 24 can be changed to change the ratio of the sulfuric acid solution and hydrogen peroxide water in the mixture. Alternatively, the open/close valve 25 of the supply tube 22 and the open/close valve 26 of the mixing tube 24 may be replaced with regulating valves so that the ratio can be changed by regulating the open degree of the tubes.

Figure 4:
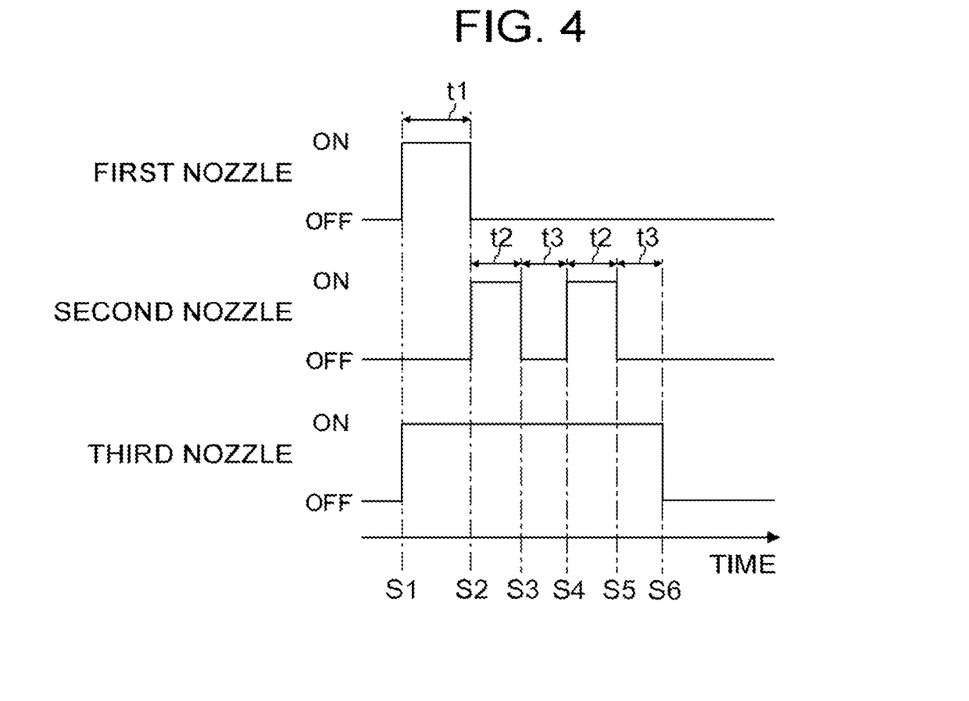
FIG. 4 is an explanatory view for explaining the timing of injecting a liquid in the substrate processing apparatus of the embodiment.

In the following, a description will be given of the operation of the substrate processing apparatus 1 with reference to FIG. 4. The controller 5 performs substrate processing based on the substrate processing information and various programs. For example, the predetermined substrate processing temperature is determined as 150° C. In this case, the first temperature is 150° C., the second temperature is less than 150° C., and the third temperature is 150° C. or higher. The sulfuric acid concentration of sulfuric acid solution is 65 wt %.

First, the substrate W is rotated on the table 2b by the rotation mechanism 2c at a predetermined rotational speed. After that, as illustrated in FIG. 4, the first nozzle 11 of the first liquid supplier 3a ejects a sulfuric acid solution of the first temperature toward the surface Wa of the substrate W in step S1. In addition, the third nozzle 31 of the third liquid supplier 3c ejects a sulfuric acid solution of the third temperature toward the surface Wb opposite to the surface Wa of the substrate W.

At this time, having been supplied from the first nozzle 11 to substantially the center of the surface Wa of the substrate W, the sulfuric acid solution spreads over the entire surface Wa by the centrifugal force of the rotation of the substrate W, which forms a liquid film on the surface. Similarly, having been supplied from the third nozzle 31 to substantially the center of the surface Wb opposite to the surface Wa, the sulfuric acid solution spreads over the entire surface Wb by the centrifugal force of the rotation of the substrate W, which forms a liquid film on the surface. In this embodiment, while the third nozzle 31 is located in a position opposite to the first nozzle 11, this is not a limitation. For example, the first nozzle 11 and the third nozzle 31 may be arranged symmetrical about the rotation axis of the substrate W.

Here, if offset is performed to supply a treatment liquid to a position deviated from the center of the surface Wa of the substrate W, the treatment liquid is not always supplied to the same position on the substrate W as compared to the case where the treatment liquid is supplied to the center of the surface Wa. That is, since the substrate W is rotating, the treatment liquid arrives at different positions on the substrate W. Accordingly, a broader area of the substrate W can be heated. Further, if the treatment liquid is ejected radially, which expands the area where the treatment liquid is supplied on the substrate W. Thus, it is possible to increase the uniformity of heating from the center to the periphery of the surface Wa.

In the first liquid supplier 3a, the heating unit 13 heats the sulfuric acid solution, and the first temperature is 150° C. Similarly, in the third liquid supplier 3c, the heating unit 33 heats the sulfuric acid solution, and the third temperature is 150° C. or higher. The sulfuric acid solution having the first temperature and that having the third temperature are ejected toward the substrate W and warms it up.

After a lapse of a predetermined time t1 from the start of the liquid supply in step S1, when the substrate W is sufficiently warmed up to the predetermined substrate processing temperature, i.e., 150° C., the first nozzle 11 stops ejecting the sulfuric acid solution in step S2. Then, the sulfuric acid solution is mixed with hydrogen peroxide water in the second liquid supplier 3b, and the second nozzle 21 ejects SPM of the second temperature toward the surface Wa of the substrate W.

At this time, having been supplied from the second nozzle 21 to substantially the center of the surface Wa of the substrate W, the SPM spreads over the entire surface Wa by the centrifugal force of the rotation of the substrate W, which forms a liquid film on the surface. Incidentally, the third nozzle 31 has continued to eject the sulfuric acid solution.

In the second liquid supplier 3b, when the sulfuric acid solution of 60° C. to 120° C. is mixed with hydrogen peroxide water of a room temperature (e.g., about 20° C. to 30° C.) the heat of reaction between them raises the temperature of the SPM to the second temperature. The second temperature is below the predetermined substrate processing temperature, i.e., the boiling point of the SPM. Thus, bumping can be prevented from occurring. In addition, it is possible to suppress the decomposition of hydrogen peroxide water, i.e., the progress of the reaction between peroxymonosulfuric acid and peroxydisulfuric acid, before the SPM arrives at the surface Wa of the substrate W. On the surface Wa of the substrate W, the hydrogen peroxide water is decomposed due to the temperature of the heated substrate W, resulting in the progress of the reaction between peroxymonosulfuric acid and peroxydisulfuric acid having high oxidizability. Thus, the resist stripping performance can be improved.

Even if the first nozzle 11 stops ejecting the sulfuric acid solution, the third nozzle 31 keeps ejecting the sulfuric acid solution. Since the surface Wa of the substrate W is kept supplied with the sulfuric acid solution of the third temperature, the temperature of the substrate W is maintained. Thus, the temperature of the substrate W is prevented from dropping due to the SPM of the second temperature ejected by the second nozzle 21.

Note that the third nozzle 31 is not always required to eject the sulfuric acid solution. For example, even when the temperature of the substrate W is decreased by the SPM of the second temperature ejected from the second nozzle 21, if it is not lower than the predetermined substrate processing temperature, the third nozzle 31 may be controlled not to eject the sulfuric acid solution.

Although the second temperature is desirably lower than the boiling point of hydrogen peroxide water, it is not so limited. The second temperature may higher than the boiling point of hydrogen peroxide water as long as lower than the first temperature.

After a lapse of a predetermined time t2 from the start of the liquid supply in step S2, when the sulfuric acid solution is replaced with the SPM on the entire surface Wa of the substrate W, the second nozzle 21 stops ejecting the SPM in step S3. Besides, the rotational speed of the substrate W is reduced to such a level that the SPM on the surface Wa is not scattered by the centrifugal force of the rotation. Consequently, the SPM is puddled (puddled state) on the surface Wa of the substrate W.

In the puddled state, the SPM is not supplied to the surface Wa of the substrate W. Accordingly, the temperature of the SPM on the surface Wa reliably rises up to the temperature of the substrate W. On the other hand, as the third nozzle 31 keeps ejecting the sulfuric acid solution toward the surface Wb opposite to the surface Wa of the substrate W, the temperature of the substrate W is prevented from dropping and maintained.

After a lapse of a predetermined time t3 from the start of the liquid supply in step S3, the second nozzle 21 ejects SPM of the second temperature toward the surface Wa of the substrate W again in step S4. Besides, the rotational speed of the substrate W is increased to such a level that the SPM on the surface Wa is scattered by the centrifugal force of the rotation. Consequently, the SPM on the surface Wa is replaced with new SPM. Note that the rotational speed of the substrate W is not necessarily increased. For example, the SPM on the surface Wa may be swept away by the new SPM.

Then, after a lapse of the predetermined time t2 from the start of the liquid supply in step S4, when the SPM puddled on the surface Wa of the substrate W is replaced with the new SPM, the second nozzle 21 stops ejecting the SPM in step S5. Besides, the rotational speed of the substrate W is reduced again to such a level that the SPM on the surface Wa is not scattered by the centrifugal force of the rotation. Consequently, the SPM is puddled (puddled state) on the surface Wa of the substrate W.

As described above, when SPM has been repeatedly ejected and puddled n times (n: 1 or more) and a predetermined time t3 has elapsed since the stop of the liquid supply in step S5, the third nozzle 31 stops ejecting the sulfuric acid solution in step S6. Besides, the rotational speed of the substrate W is increased to such a level that the SPM on the surface Wa is scattered by the centrifugal force of the rotation. Consequently, the SPM on the surface Wa is thrown off the surface Wa, and thereafter, the substrate W stops rotating.

While the start and stop of the liquid supply are described as being determined based on the lapse of the predetermined time, it can be determined by other means. For example, the thickness of a film of the treatment liquid supplied to the substrate W may be measured to make the determination according to the film thickness. In this case, for example, when the liquid film is thickened to a predetermined thickness after the start of liquid supply, the liquid supply is stopped. When the liquid film is thinner than the predetermined thickness, the liquid supply takes place. For another example, the temperature of the treatment liquid supplied to the substrate W may be measured by a thermometer to start and stop the liquid supply according to the temperature.

When discharged from the substrate W, the SPM of the second temperature is mixed with at least the sulfuric acid solution having a high temperature ejected to the opposite surface Wb, the decomposition of hydrogen peroxide water progresses, which leaves a sulfuric acid solution. The sulfuric acid solution flows from the cup 2a through the recovery tube 4a and cooled by the cooling part 4b. After that, the sulfuric acid solution is collected in the reservoir 41. In SPM, when peroxymonosulfuric acid and peroxydisulfuric acid are generated, the hydrogen peroxide water is decomposed into oxygen and water. Although oxidation by peroxymonosulfuric acid and peroxydisulfuric acid is acting during the resist stripping, it disappears as the reaction progresses due to a high temperature (substrate temperature). As a result, remaining sulfuric acid and water are scattered from the surface of the substrate, and mixed with the sulfuric acid solution ejected to the opposite surface of the substrate W.

On the completion of the resist removal using SPM, washing is performed. If performing the resist removal and washing in the same substrate treatment tank 2, the substrate processing apparatus 1 desirably includes two liquid receiving basins and a mechanism for switching them from one to another so that the sulfuric acid solution discharged from the substrate W is not mixed with washing water. In this case, the mechanism switches the liquid receiving basins depending on the treatment liquid. After the washing, the substrate W may be treated with another treatment liquid in the same substrate treatment tank 2. In this case, the substrate processing apparatus 1 desirably includes a mechanism for switching treatment liquids so that they are not mixed together. The substrate W may be treated with another treatment liquid in a different treatment tank. After the final washing, the substrate W is dried, and the process ends.

As described above, according to the embodiment, before SPM is supplied to the surface Wa of the substrate W, i.e., a surface to be treated, the substrate W is heated to or above the boiling point of hydrogen peroxide water by a sulfuric acid solution having the first temperature that is equal to or higher than the boiling point of hydrogen peroxide water. For this reason, when supplied to the surface Wa, SPM having the second temperature, which is lower than the first temperature, is heated on the surface Wa to or above the boiling point of hydrogen peroxide water. At this time, hydrogen peroxide water contained in the SPM is efficiently decomposed, which generates peroxymonosulfuric acid and peroxydisulfuric acid having high oxidizability. Thus, a resist can be reliably removed, resulting in improved treatment performance.

Further, a sulfuric acid solution and hydrogen peroxide water are mixed together into SPM, and then supplied to the surface Wa of the substrate W. Until arriving at the surface Wa, the SPM has the second temperature that is lower than the first temperature. Therefore, the decomposition of hydrogen peroxide water can be suppressed until the SPM arrives at the surface Wa. In other words, as the SPM is given the second temperature that is lower than the first temperature, hydrogen peroxide water can be prevented from being lost before the SPM arrives at the surface Wa. Since the decomposition of hydrogen peroxide water, i.e., the progress of the reaction between peroxymonosulfuric acid and peroxydisulfuric acid, is suppressed until the SPM arrives at the surface Wa, there is no need of large amounts of hydrogen peroxide water to be mixed with a sulfuric acid solution. This reduces the usage of hydrogen peroxide water and suppresses a decrease in sulfuric acid concentration, thereby facilitating the recycle of treatment liquid. Thus, the total usage of treatment liquid can be reduced.

Note that, as described above, the substrate W is heated by a sulfuric acid solution. For example, a heater emits infrared rays for heating, and if used to heat the substrate W, the infrared rays are not absorbed, but penetrate the substrate W (e.g., semiconductor wafer). If the rays are not absorbed and pass through the substrate W, the substrate W itself is not heated. When treatment liquid is present on the substrate W, it absorbs the infrared rays from the heater. That is, not the substrate W but rather only the treatment liquid is heated. Accordingly, the substrate W is heated by means of the heated treatment liquid. In this case, it takes time to heat the treatment liquid to a high temperature to heat the substrate W. Besides, if SPM is used as the treatment liquid, the SPM is heated before the substrate W. As a result, the reaction between peroxymonosulfuric acid and peroxydisulfuric acid progresses in the SPM, and the high oxidizability is lost immediately. Accordingly, a resist cannot be stripped.

On the other hand, when hot sulfuric acid solution is used as a means for heating, its heat is transmitted to the substrate W. Thus, it does not take long time to heat the substrate W itself. Consequently, the substrate W has a high temperature, and its heat is transmitted to low-temperature SPM supplied thereto. This promotes the reaction and facilitates the resist stripping. In this manner, the heating of the substrate W by a sulfuric acid solution contributes to the resist stripping. From that point of view, hot liquids other than sulfuric acid solution may be used as a heating medium. By supplying a high-temperature liquid used as a heating medium to the surface Wa of the substrate W, the surface Wa can be directly heated. Thus, the efficiency of heating the surface Wa of the substrate W is increased as compared to indirect heating with the use of a heater or the like.

Here, sulfuric acid solution is used as a heating medium because when the reaction of SPM takes place on the surface Wa of the substrate W, hydrogen peroxide water is decomposed into water, peroxymonosulfuric acid (persulfuric acid), and peroxydisulfuric acid. Accordingly, SPM can be recovered as sulfuric acid solution. That is, the sulfuric acid solution can be recycled as a heating medium or a solution for generating SPM. For example, if a heated liquid other than sulfuric acid solution is used as a heating medium, discharged liquid needs to be separated into a heated liquid and sulfuric acid solution as being recovered to recycle it. Meanwhile, if sulfuric acid solution is used as a heating medium as described above, the discharged liquid is sulfuric acid solution. This eliminates the need of separating the discharged liquid as being recovered. Therefore, only a tube for sulfuric acid solution suffices, and a separation recovery mechanism is no longer needed. Thus, the apparatus can be simplified.

(Other Embodiments)

While, in the above embodiment, the first liquid supplier 3a supplies the surface Wa of the substrate W with a sulfuric acid solution of the first temperature, this is not a limitation. For example, instead of supplying the surface Wa with a sulfuric acid solution, the third liquid supplier 3c may supply the surface Wb opposite to the surface Wa with a sulfuric acid solution of the third temperature, i.e., a sulfuric acid solution with the first temperature or higher, to heat the substrate W. That is, as long as the substrate W can be heated by a sulfuric acid solution of the first temperature or higher, the solution may be supplied to either the surface Wa to be treated or the surface Wb opposite thereto.

In addition, the substrate W need not necessarily be heated by only a heated sulfuric acid solution as described in the above embodiment. In addition to the sulfuric acid solution, an auxiliary means may be used to heat the substrate W. Examples of the auxiliary means include a heating part, such as a lamp that emits light, a heater that generates heat, an electromagnetic heater that uses electromagnetic waves, and a hot plate. Note that, if the substrate W is heated by the heating part before by the sulfuric acid solution, a resist may be carbonized on the surface Wa and not be easily removed. Therefore, the substrate W is desirably heated by the sulfuric acid solution before by the heating part.

Besides, the substrate processing apparatus 1 of the embodiment may further include a concentration detector to detect the sulfuric acid concentration of a sulfuric acid solution in the cup 2a of the substrate treatment tank 2 or flowing in the recovery tube 4a of the liquid return part 4. In this case, while the second liquid supplier 3b is supplying a treatment liquid, the controller 5 can control the supply of a liquid from the first liquid supplier 3a (i.e., the open/close valve 14) according to the sulfuric acid concentration detected by the concentration detector. For example, when the sulfuric acid concentration drops to below a predetermined value (e.g., 65 wt %), the controller controls the first liquid supplier 3a to supply a sulfuric acid solution of the first temperature. When the sulfuric acid concentration rises to the predetermined value or higher, the controller 5 controls the first liquid supplier 3a to stop the supply of the sulfuric acid solution of the first temperature. With this, the sulfuric acid concentration of a sulfuric acid solution to be recovered, i.e., the sulfuric acid concentration of a sulfuric acid solution in the reservoir 41, can be maintained at the predetermined value.

Further, in the above embodiment, when moved along the surface Wa of the substrate W to supply the surface Wa with SPM of the second temperature, the second nozzle 21 is desirably moved from the periphery to the center of the surface Wa. This is because the substrate W becomes cold from the periphery to the center of the surface Wa. Compared to the case where SPM of the second temperature is supplied to substantially the center of the surface Wa of the substrate W, or is supplied while the second nozzle 21 is being moved from the center to the periphery of the surface Wa, the entire surface Wa of the substrate W is prevented from getting cold at once by the SPM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
a first liquid supplier configured to supply a surface to be treated of a substrate with a sulfuric acid solution having a first temperature that is equal to or higher than a boiling point of hydrogen peroxide water;
a second liquid supplier configured to supply the surface to be treated of the substrate with a mixture of sulfuric acid solution and hydrogen peroxide water, the mixture having a second temperature that is lower than the first temperature;
a third liquid supplier configured to supply an opposite surface to the surface to be treated of the substrate with a sulfuric acid solution having a third temperature that is equal to or higher than the first temperature;
a controller configured to control the first liquid supplier to supply the sulfuric acid solution having the first temperature so as to heat the substrate to the boiling point of hydrogen peroxide water or higher, and, when temperature of the substrate becomes equal to or higher than the boiling point of hydrogen peroxide water, control the first liquid supplier to stop supplying the sulfuric acid solution having the first temperature, control the second liquid supplier to supply the mixture having the second temperature, and control the third liquid supplier to supply the sulfuric acid solution having the third temperature so as to maintain the temperature of the substrate equal to or higher than the boiling point of hydrogen peroxide water;
a first reservoir configured to retain the sulfuric acid solution;
a circulation tube configured to circulate the sulfuric acid solution in the first reservoir;
a second reservoir configured to retain the hydrogen peroxide water;
a first heating unit configured to heat the sulfuric acid solution retained in the first reservoir;
a liquid return part configured to collect the sulfuric acid solution and the mixture supplied to the substrate from the first liquid supplier, the second liquid supplier, and the third liquid supplier in the first reservoir as recovered liquid; and
a first supply tube, a second supply tube, and a third supply tube, each connected to the circulation tube, in which the sulfuric acid solution retained in the first reservoir flows, wherein
the first liquid supplier includes the first supply tube,
the second liquid supplier includes the second supply tube,
the third liquid supplier includes the third supply tube,
the first supply tube is provided with a second heating unit configured to heat the sulfuric acid solution flowing therein,
the second supply tube is connected to a mixing tube in which the hydrogen peroxide water retained in the second reservoir flows, and
the third supply tube is provided with a third heating unit configured to heat the sulfuric acid solution flowing therein.

2. The substrate processing apparatus according to claim 1, wherein the liquid return part including a recovery tube and a cooling part configured to cool the recovered liquid flowing in the recovery tube.

3. The substrate processing apparatus according to claim 1, wherein the first heating unit is located in the circulation tube.

4. The substrate processing apparatus according to claim 3, wherein temperature at which the first heating unit heats the sulfuric acid solution flowing in the circulation tube is below boiling point of the sulfuric acid solution.

5. The substrate processing apparatus according to claim 1, wherein
weight percent concentration of sulfuric acid in the sulfuric acid solution is 65% or higher,
the first temperature is in a range of 150° C. to 308° C., and
the second temperature is below 150° C.

6. The substrate processing apparatus according to claim 1, wherein the second heating unit is further configured to heat the sulfuric acid solution flowing in the first supply tube to the first temperature.

7. The substrate processing apparatus according to claim 1, wherein the third heating unit is further configured to heat the sulfuric acid solution flowing in the third supply tube to the third temperature.

8. The substrate processing apparatus according to claim 1, wherein
the first liquid supplier includes a first nozzle connected to the first supply tube,
the third liquid supplier includes a third nozzle connected to the third supply tube, and
the third nozzle is located in a position facing the first nozzle.

9. The substrate processing apparatus according to claim 1, wherein
the controller is further configured to control the first liquid supplier to supply the sulfuric acid solution having the first temperature and the third liquid supplier to supply the sulfuric acid solution having the third temperature at the same time.

10. The substrate processing apparatus according to claim 1, wherein
the second liquid supplier includes a second nozzle connected to the second supply tube, and
the second nozzle is moved from a periphery of the surface to be treated of the substrate to its center when the second liquid supplier supplies the surface to be treated of the substrate with the mixture of the sulfuric acid solution and the hydrogen peroxide water from the second nozzle.

\* \* \* \* \*